(12) United States Patent
Pei et al.

(10) Patent No.: US 11,374,041 B2
(45) Date of Patent: Jun. 28, 2022

(54) SYSTEMS AND METHODS FOR IMAGING USING MECHANICAL SCANNING MECHANISMS

(71) Applicant: Cepton Technologies, Inc., San Jose, CA (US)

(72) Inventors: Jun Pei, Saratoga, CA (US); Dongyi Liao, Mountain View, CA (US); Mark A. McCord, Los Gatos, CA (US)

(73) Assignee: Cepton Technologies, Inc., San Jose, CA (US)

(*) Notice: Subject to any disclaimer, the term of this patent is extended or adjusted under 35 U.S.C. 154(b) by 120 days.

(21) Appl. No.: 16/752,456

(22) Filed: Jan. 24, 2020

(65) Prior Publication Data
US 2020/0243577 A1 Jul. 30, 2020

Related U.S. Application Data

(60) Provisional application No. 62/797,112, filed on Jan. 25, 2019.

(51) Int. Cl.
| | |
|---|---|
| *H01L 27/146* | (2006.01) |
| *H01L 31/107* | (2006.01) |
| *H04N 5/369* | (2011.01) |
| *H04N 5/349* | (2011.01) |
| *H04N 5/225* | (2006.01) |
| *H04N 5/33* | (2006.01) |

(52) U.S. Cl.
CPC .......... *H01L 27/146* (2013.01); *H01L 31/107* (2013.01); *H04N 5/349* (2013.01); *H04N 5/369* (2013.01); *H04N 5/2253* (2013.01); *H04N 5/2254* (2013.01); *H04N 5/2259* (2013.01); *H04N 5/33* (2013.01)

(58) Field of Classification Search
CPC ................. H01L 27/146; H01L 31/107; H01L 27/14618; H04N 5/369; H04N 5/2253; H04N 5/2254; H04N 5/33; H04N 5/2259; H04N 5/349
See application file for complete search history.

(56) References Cited

U.S. PATENT DOCUMENTS

| | | | | |
|---|---|---|---|---|
| 6,424,735 | B1* | 7/2002 | Freifeld | G01B 11/2518 356/3 |
| 2009/0046474 | A1* | 2/2009 | Sato | F21S 41/176 362/466 |
| 2017/0195584 | A1* | 7/2017 | Kostrzewa | H04N 5/2253 |
| 2017/0307758 | A1* | 10/2017 | Pei | G01S 7/4972 |

* cited by examiner

*Primary Examiner* — Padma Haliyur
(74) *Attorney, Agent, or Firm* — Kilpatrick Townsend & Stockton LLP

(57) ABSTRACT

An imaging system includes a base, an imaging lens fixedly attached to the base, a board, a first set of flexures flexibly attaching the board to the base, and a detector mounted on the board and positioned at an image plane of the imaging lens. The imaging system further includes a driving mechanism configured to scan the board via the first set of flexures in a plane substantially perpendicular to an optical axis of the imaging lens, thereby scanning the detector to a plurality of image positions in the image plane. The imaging system further includes electronic circuitry configured to read out a respective electrical signal output by the detector as the detector is scanned to each respective image position of the plurality of image positions in the image plane, and generate an image based on the electrical signals read out from the detector at the plurality of image positions.

19 Claims, 6 Drawing Sheets

SYSTEMS AND METHODS FOR IMAGING USING MECHANICAL SCANNING MECHANISMS

CROSS-REFERENCES TO RELATED APPLICATIONS

This application claims the benefit and priority to U.S. Provisional Application No. 62/797,112, filed Jan. 25, 2019, entitled "SYSTEMS AND METHODS FOR IMAGING USING MECHANICAL SCANNING MECHANISMS," the entire content of which is incorporated herein by reference for all purposes.

BACKGROUND OF THE INVENTION

For some imaging applications, the size of each detector element, or the circuitry associated with each detector element, may be larger than the desired pixel density. For example, low-light imaging, infra-red (IR) imaging, ultraviolet (UV) imaging, flash LiDAR imaging, and the like, may require relatively large photodetectors. Therefore, there is a need for imaging systems that can achieve high pixel resolution using a sparse detector array.

SUMMARY OF THE INVENTION

According to some embodiments, an imaging system includes a base, an imaging lens fixedly attached to the base, a board, a first set of flexures flexibly attaching the board to the base, and a detector mounted on the board and positioned substantially at an image plane of the imaging lens. The detector is configured to detect light focused by the imaging lens and incident thereon. The imaging system further includes a driving mechanism configured to scan the board via the first set of flexures in a plane substantially perpendicular to an optical axis of the imaging lens, thereby scanning the detector to a plurality of image positions in the image plane. The imaging system further includes electronic circuitry configured to read out a respective electrical signal output by the detector as the detector is scanned to each respective image position of the plurality of image positions in the image plane, and generate an image based on the electrical signals read out from the detector at the plurality of image positions.

According to some embodiments, an imaging system includes a base, an imaging lens, a first set of flexures flexibly attaching the imaging lens to the base, a board, and a detector mounted on the board and positioned substantially at a focal plane of the imaging lens. The detector is configured to detect light focused by the imaging lens and incident thereon. The imaging system further includes a driving mechanism configured to scan the imaging lens via the first set of flexures to a plurality of lens positions in a first plane substantially perpendicular to an optical axis of the imaging lens, so that light from a respective field angle is focused onto the detector at each respective lens position. The imaging system further includes electronic circuitry configured to read out a respective electrical signal output by the detector as the imaging lens is scanned to each respective lens position, and generate an image based on the electrical signals read out from the detector at the plurality of lens positions.

According to some embodiments, a method of generating an image includes focusing, using an imaging lens, light onto a focal plane of the imaging lens; and scanning a detector relative to the imaging lens to a plurality of detector positions on the focal plane. The method further includes reading out a respective electrical signal output by the detector as the detector is scanned to each respective detector position of the plurality of detector positions; and generating an image based on the electrical signals read out from the detector at the plurality of detector positions.

DETAILED DESCRIPTION OF THE SPECIFIC EMBODIMENTS

Embodiments of the present invention provide systems and methods for generating an image using fewer detection elements than there are pixels in the image. A sparse array of detection elements is mechanically scanned relative to an imaging lens in order to generate an image with much higher pixel density than the array of detection elements, and correspondingly higher resolution.

According to some embodiments, a two-dimensional image may be acquired by rapidly scanning a sparse array of detectors relative to a lens. The scanning is a mechanical one-dimensional or two-dimensional motion using flexures. The flexures can be resonant flexures or non-resonant flexures, or can be a combination of resonant flexures and non-resonant flexures. For two-dimensional scanning, the scan may be of a Lissajous type of pattern. The technique is applicable where the size of each detector element, or the circuitry associated with each detector element, is larger than the desired pixel density. Applications may include low-light imaging, infra-red (IR) imaging, ultraviolet (UV) imaging, flash LiDAR imaging, and the like.

Figure 1:
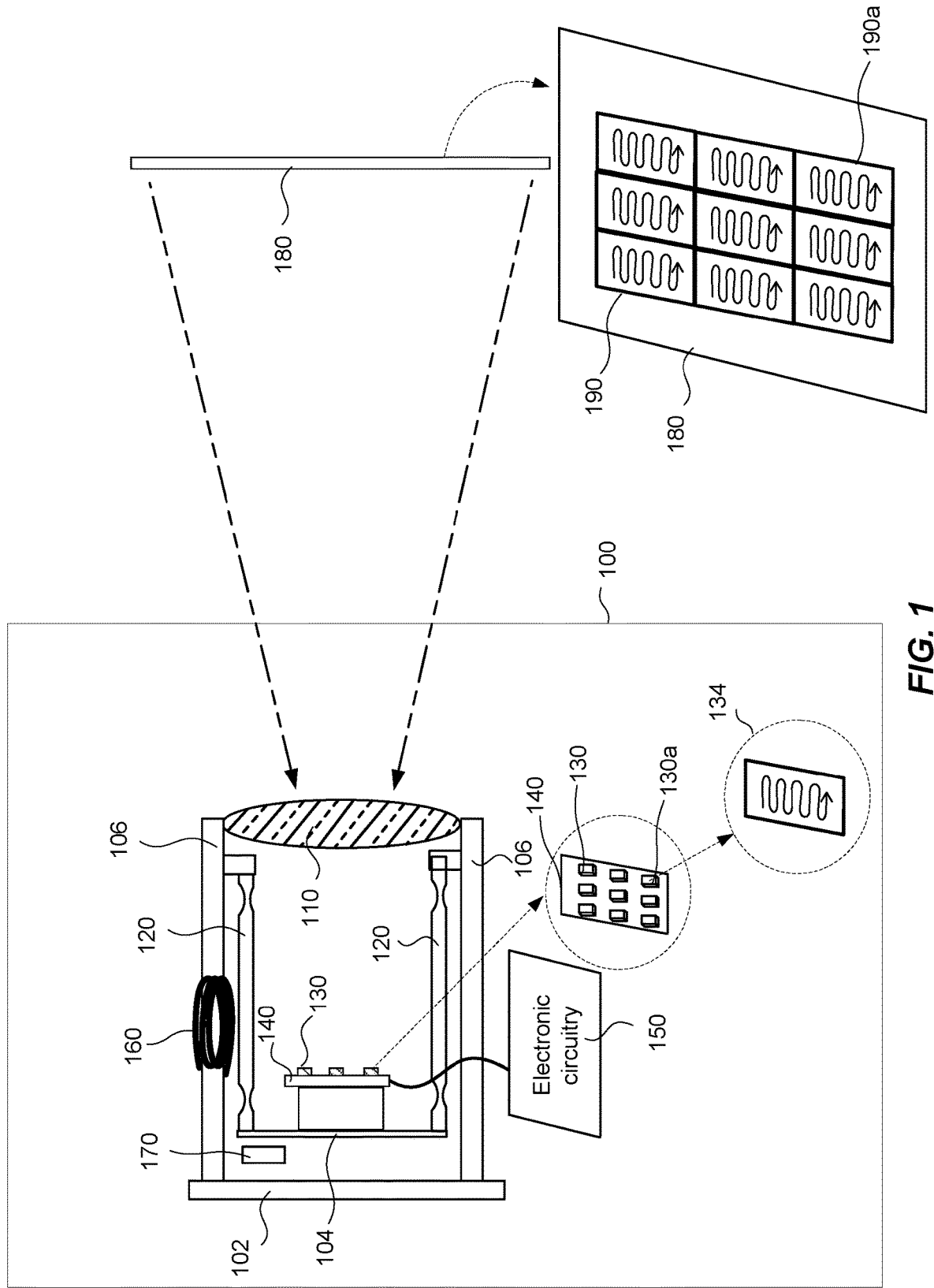
FIG. 1 shows a schematic diagram illustrating an exemplary imaging system according to some embodiments.

FIG. 1 shows a schematic diagram illustrating an exemplary imaging system 100 according to some embodiments. The imaging system 100 includes an imaging lens 110, and one or more detectors 130 mounted on a board 140. The board 140 may be referred herein as an optoelectronic board. The board 140 is attached to a platform 104. The imaging lens 110 is fixedly attached to a base 102 via a rigid support structure 106. The platform 104 is flexibly attached to the support structure 106 via a set of flexures 120. The board 140 is spaced apart from the imaging lens 110 along an optical axis 112 of the imaging lens 110, so that the detectors 130 are positioned substantially at a focal plane or an image plane of the imaging lens 110.

The set of flexures 120 may comprise a set of flexible beams that can be bended in one dimension or two dimensions. A driving mechanism 160 may cause the set of flexures 120 to bend in an oscillatory motion, so as to scan the detectors 130 in the image plane. The detectors 130 may be scanned in one dimension or two dimensions in the image plane according to various embodiments. As each respective detector 130 is scanned to a respective detector position (also referred herein as an image position) in the image plane, the respective detector 130 detects an optical signal at a respective pixel of the image plane.

In the example illustrated in FIG. 1, nine detectors 130 are arranged as a 3×3 focal plane array (FPA). The scanning of each detector 130 may cover a corresponding subfield of the object 190 being imaged. The FPA may be scanned relative to the imaging lens 110 so that the gaps between detector elements are filled in by the scanning motion. Thus, the imaging system 100 may generate an image with relatively high pixel density (hence relatively high resolution) using a relatively sparse array of detector elements. Such an imaging system may be particularly advantageous in applications in which the size of each detector element, or the circuitry associated with each detector element, is larger than the desired pixel density. Exemplary detectors may include infrared narrow band-gap semiconductor detectors, infrared bolometers, single-photon detectors, avalanche semiconductor detectors, photo-multiplier tubes, and the like.

The driving mechanism 160 may include, for example, one or more voice coils, or one or more piezoelectric transducers, or one or more linear motors. In some embodiments, the imaging system 100 may include a position sensing encoder 170 configured to determine the position of the board 140 as the board 140 is being scanned. To achieve a relatively large scanning motion with minimal power, the driving mechanism 160 may be operated at or nearly at a resonance frequency of the flexures 120. In the case of two-dimensional scanning, the driving mechanism 160 may be operated at a resonance frequency of the flexures 120 in one dimension and at a non-resonance frequency in the other dimension (e.g., for a raster scan pattern), or nearly at the resonance frequency in both dimensions (e.g., for a Lissajous scan pattern).

As an example, the inset 134 in FIG. 1 illustrates a raster scan pattern of one of the detectors 130a. As the detector 130a is scanned to each respective detector position in the image plane, the detector 130a may detect light that originates from a respective field angle and is focused by the imaging lens 110 to the respective detector position. As an example, assuming that an object 180 being imaged by the imaging lens 110 is a display screen or a poster, at each respective detector position, the detector 130a may detect an optical signal corresponding a respective portion of the object 180. Thus, as the detector 130a is raster scanned, the detector 130a may sequentially detect optical signals from corresponding portions of the object 190a in a similar raster pattern, as illustrated in FIG. 1.

The imaging system 100 further includes electronic circuitry 150 coupled to the detectors 130. The electronic circuitry 150 is configured to read out a respective electrical signal output by each detector 130 as the detector 130 is scanned to each respective image position in the image plane. For example, the electrical signal may be proportional to the intensity of the optical signal at that image position or pixel position. The electronic circuitry 150 then generates an image based on the electrical signals read out from the detectors 130 at various image positions.

The imaging system 100 may further include a position sensing encoder 170 for determining the position of the board 140 more accurately as the board 140 is being scanned. The positions of the board 140 determined by the position sensing encoder 170 may be input into the electronic circuitry 150 for generating the image. In some embodiments, the electronic circuitry 150 may use signals from the position sensing encoder 170 to trigger each pixel acquisition (e.g., read out an electrical signal output by each detector 130), so that the electrical signal that is read out from each detector 130 is properly correlated with the detector position.

A raster scan pattern may be achieved by scanning the board 140 in a first dimension (e.g., in the horizontal direction) relatively quickly, and in a second dimension orthogonal to the first dimension (e.g., in the vertical direction) relatively slowly. For example, the board 140 may be placed on a first scanning stage that is scanned relatively rapidly in one dimension using a resonant flexure. The first scanning stage may be placed on a second scanning stage that is scanned relatively slowly in the orthogonal dimension, such that the combined motion executes a raster scan. The slower stage may or may not be resonant.

Although a raster scan pattern is illustrated in FIG. 1 as an example, other scan patterns are also possible, including but not limited to one dimensional scan patterns (e.g., either in the vertical direction or in the horizontal direction), two-dimensional Lissajous scan patterns, and the like. A two-dimensional Lissajous scan pattern may be achieved by scanning the board 140 in two orthogonal dimensions at close but slightly different frequencies using two-dimensional flexures. For two-dimensional scanning, a set of rod springs (e.g., four rod springs) may be used as flexures. The rod springs may be made to have slightly different resonance frequencies in the horizontal direction and the vertical direction. In some embodiments, the scanning frequencies in the horizontal direction and the vertical direction may be advantageously chosen to correspond to the resonance frequencies of the rod springs in the horizontal direction and the vertical direction, respectively.

Figure 2A:
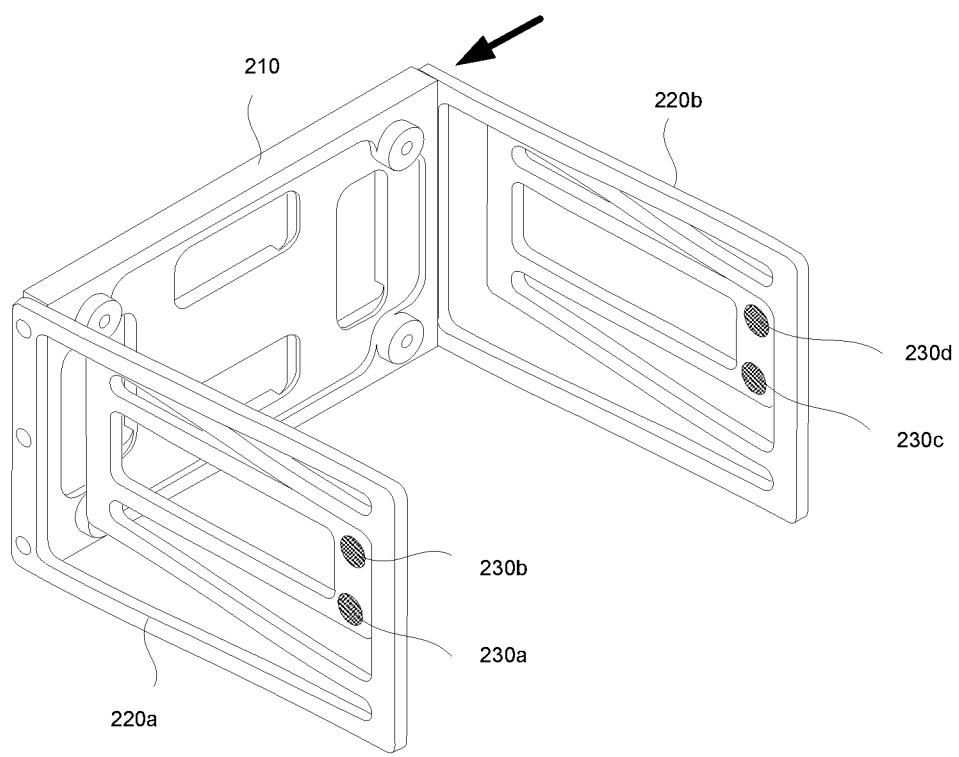
FIGS. 2A and 2B illustrate schematically a flexure mechanism for two-dimensional scanning according to some embodiments.
Figure 2B:
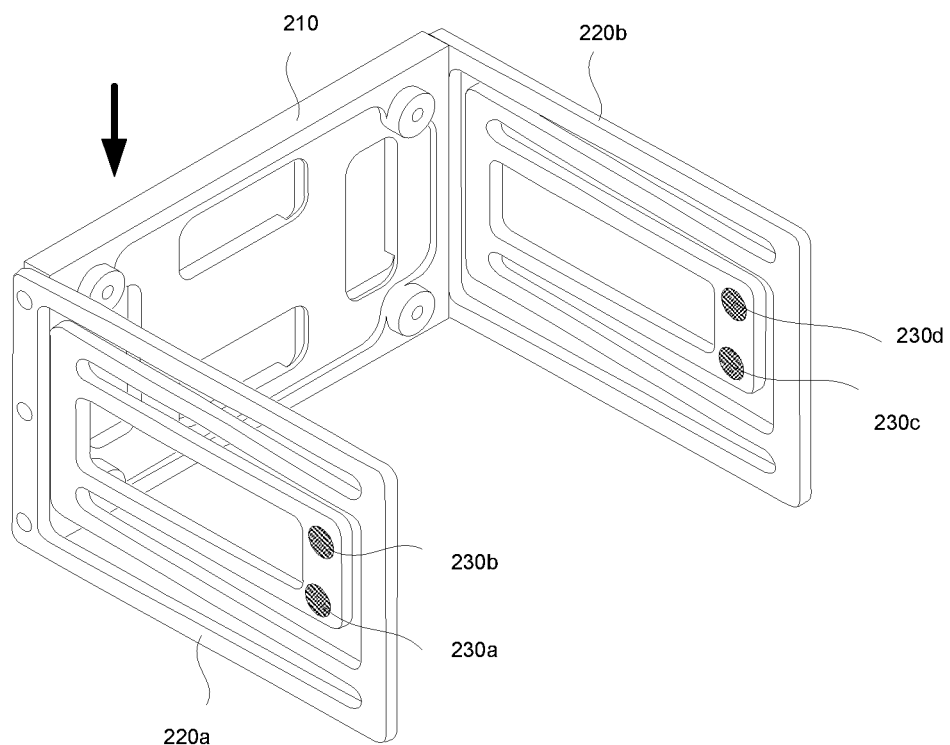

Other types of two-dimensional flexures different from the rod springs may also be used. FIGS. 2A and 2B illustrate schematically a flexure mechanism for two-dimensional scanning according to some embodiments. A frame 210 may be attached to a pair of flexures 220a and 220b on either side thereof. The frame 210 may carry a board 140, such as the board 140 in the imaging system 100 illustrated in FIG. 1. Each of the pair of flexures 220a and 220b may be fabricated by cutting a plate of spring material. A convolution configuration, as illustrated in FIGS. 2A and 2B, may be used to increase the effective length of the spring member. One end of each of the pair of flexures 220a and 220b may be attached to fixed mounting points 230a-230d. The pair of flexures 220a and 220b may be flexed in both the horizontal direction and the vertical direction, so as to move the frame 210 horizontally and vertically, as indicated by the double-sided arrows in FIGS. 2A and 2B, respectively. To scan the board 140 of a imaging system 100 horizontally and vertically, the frame 210 may be vibrated at or near its resonance frequencies in both horizontal and vertical directions.

Figure 3:
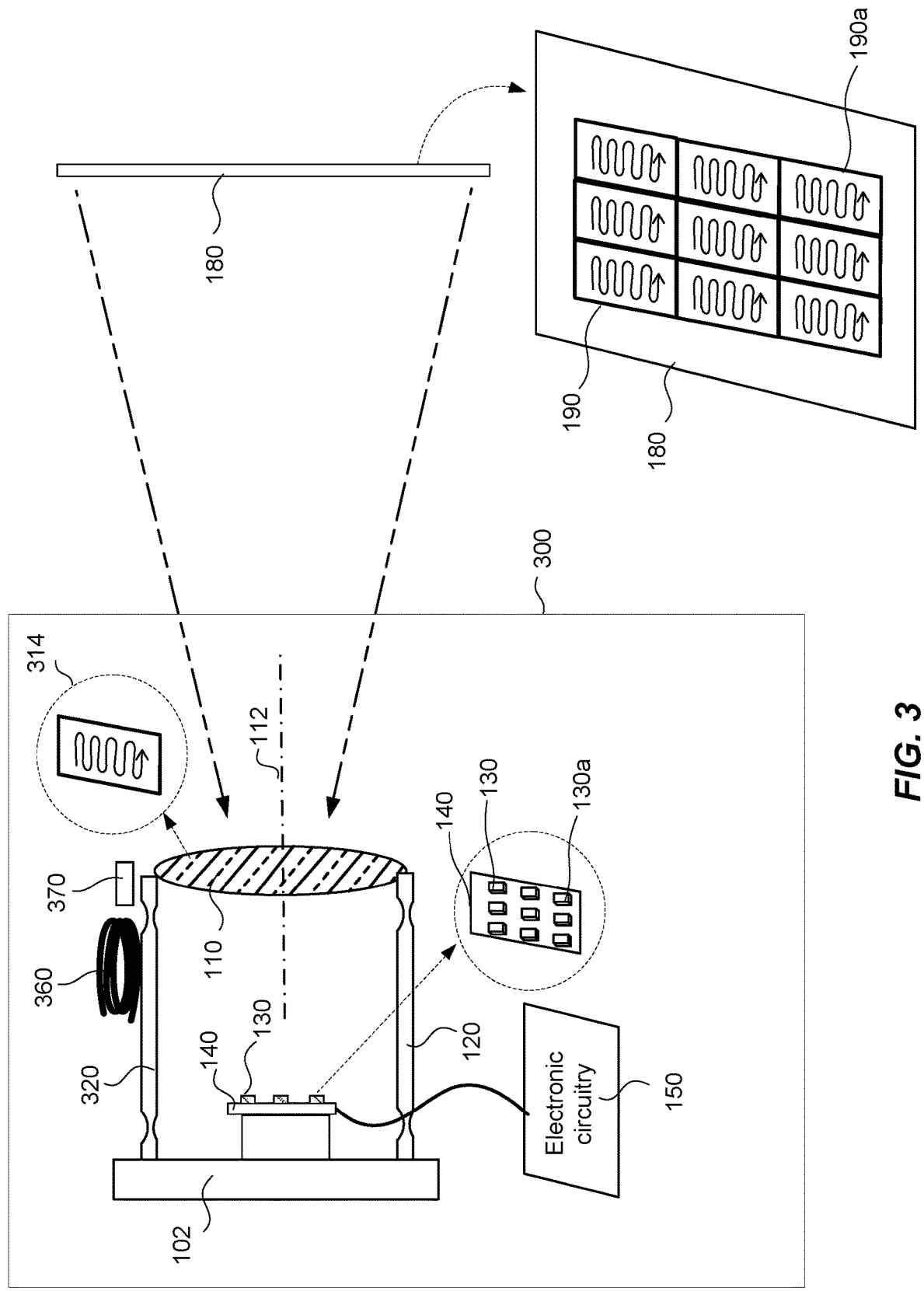
FIG. 3 illustrates an imaging system according to some embodiments.

According to some embodiments, an imaging system may have the board 140 fixed while scanning the lens 110 relative to the board 140. FIG. 3 illustrates an imaging system 300 according to some embodiments. Here, the board 140 fixedly attached to the base 102. The imaging lens 110 is flexibly attached to the base 102 via a set of flexures 320. A driving mechanism 360 may cause the set of flexures 320 to bend in an oscillatory motion, so as to scan the imaging lens 110 in a plane perpendicular to the optical axis 112 of the imaging lens 110. As an example, the inset 314 in FIG. 3 illustrates a raster scan pattern of imaging lens 110. The relative motion between the imaging lens 110 and the detectors 130 may sequentially focus optical signals from corresponding portions of the object 190a on to each detector 130 in a similar raster pattern, as illustrated in FIG. 3. A position sensing encoder 370 may determine the position of the imaging lens 110, which may be input into the electronic circuitry 150 for generating an image.

Figure 4:
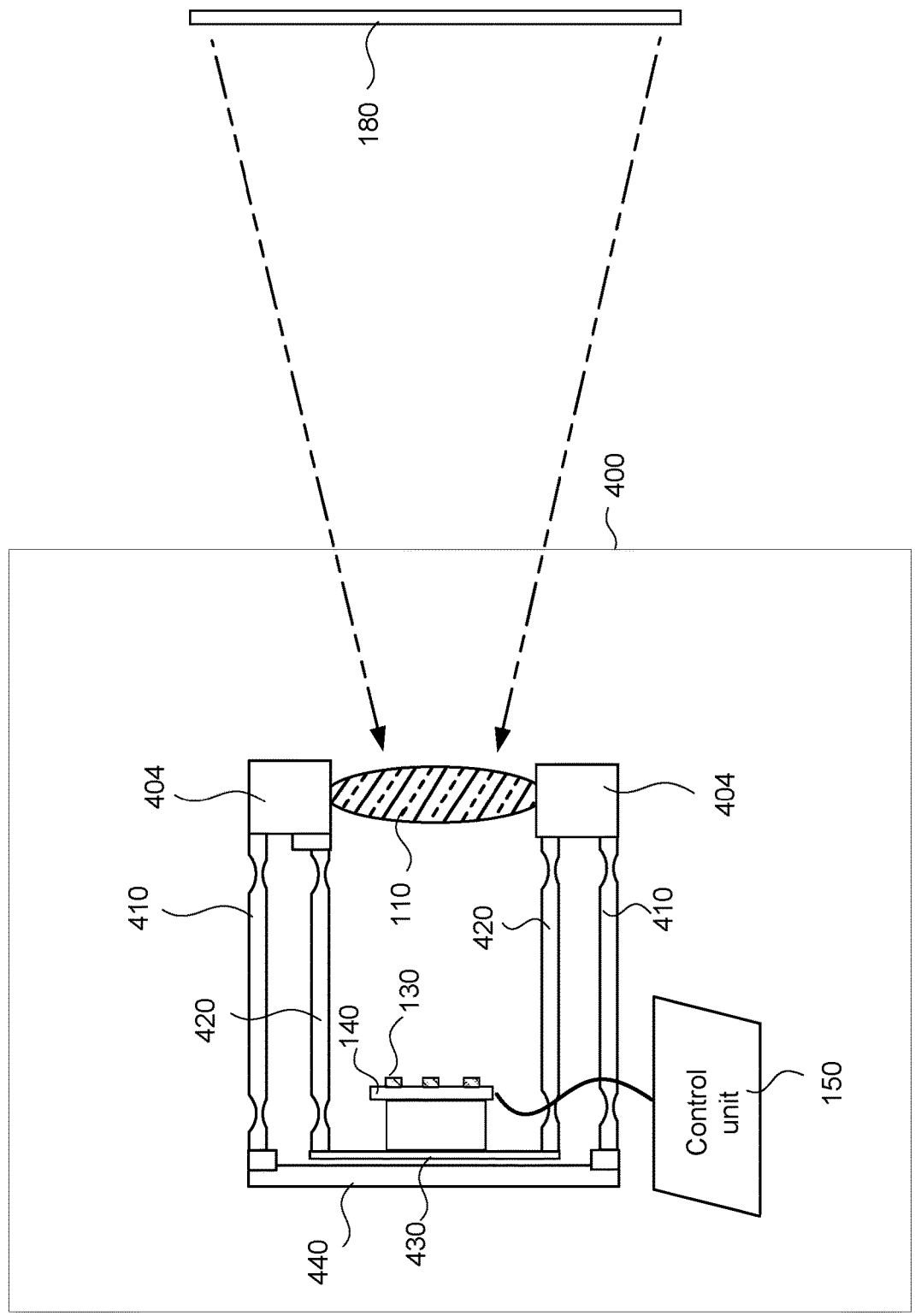
FIG. 4 illustrates an imaging system according to some other embodiments.

FIG. 4 illustrates an imaging system 400 according to some other embodiments. Here, the imaging lens 110 is attached to a fixed lens mount 404. The lens mount 404 may be fixedly attached to a base (not shown). The board 140 on which the detectors 130 are mounted is attached to a platform 430, which is in turn flexibly attached to the fixed lens mount 404 via a first set of flexures 420. The imaging system 400 also includes a counterbalance structure 440, which is flexibly attached to the fixed lens mount 404 via a second set of flexures 410. A driving mechanism (not shown) may cause the platform 430 and the counterbalance structure 440 to be scanned in opposite directions at any instant, so that vibration of the imaging system 400 may be mitigated or minimized.

Figure 5:
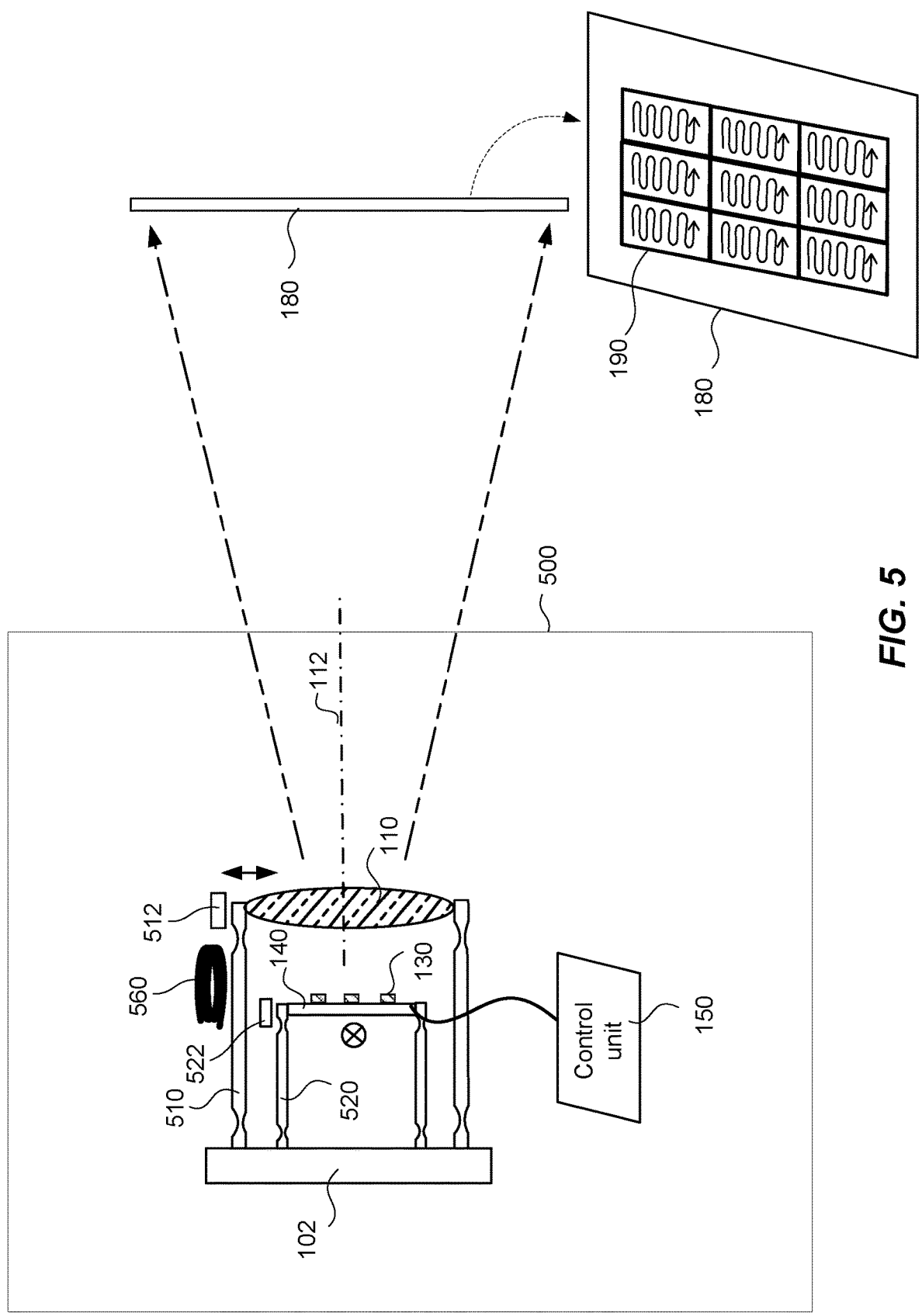
FIG. 5 illustrates an imaging system according to some further embodiments.

FIG. 5 illustrates an imaging system 500, in which both the imaging lens 110 and the detectors 130 are scanned, according to some embodiments. Here, the imaging lens 110 is flexibly attached to the base 102 via a first set of flexures 510. The optoelectronic board 140 carrying the detectors 130 is flexibly attached to the base 102 via a second set of flexures 520. The optoelectronic board 140 is spaced apart from the imaging lens 110 along the optical axis 112 of the imaging lens 110 so that the detectors 130 are positioned substantially at the focal plane of the imaging lens 110. A driving mechanism 560 may cause the first set of flexures 510 to bend in an oscillatory motion, thereby scanning the imaging lens 110 in a first plane substantially perpendicular to the optical axis 112 of the imaging lens 110. The driving mechanism 560 may also cause the second set of flexures 520 to bend in an oscillatory motion, thereby scanning the detectors 130 in the focal plane of the imaging lens 110.

According to some embodiments, the imaging lens 110 may be scanned in first dimension (e.g., in the vertical direction as indicated by the double arrow), and the detectors 130 may be scanned in a second dimension orthogonal to the first dimension (e.g., in the horizontal direction as indicated by the cross), so that the image is effectively scanned in two dimensions. In some embodiments, to achieve a raster scan pattern, the imaging lens 110 may be scanned rapidly in one dimension, while the detectors 130 are scanned slowly in the orthogonal dimension; or the detectors 130 may be scanned rapidly in one dimension, while the imaging lens 110 is scanned slowly in the orthogonal dimension.

According to some embodiments, both the imaging lens 110 and the detectors 130 may be scanned in two dimensions. For example, the imaging lens 110 and the detectors 130 may be scanned synchronously so that the imaging lens 110 and the detectors 130 move in opposite directions at any instant. This may allow a relatively large effective scan range with a relatively small mechanical motion of the imaging lens 110 and the detectors 130. Also, the vibration that may be caused by the motion of the imaging lens 110 may be substantially canceled by the vibration that may be caused by the motion of the detectors 130.

Applications

Various applications may include for instance IR or UV cameras, where the detection elements are either large, expensive, or difficult to integrate into a dense array on a single chip.

As an example, one technique for making an IR FPA (infra-red focal plane array) may involve attaching narrow-bandgap semiconductor photodiodes onto a silicon processing chip. Because of cost and space considerations, a dense array may not be practical. By scanning the FPA and/or the imaging lens according embodiments of the present invention, high-resolution images may be acquired using a relatively sparse array of detectors.

Another area of application is flash LiDAR, where significant processing power is needed for each detector. The available area on the imaging chip is only sufficient for a limited number of detector circuits. By scanning the detector and/or the lens, a high resolution LiDAR image can be achieved by sequentially acquiring pixels during the scan.

Figure 6:
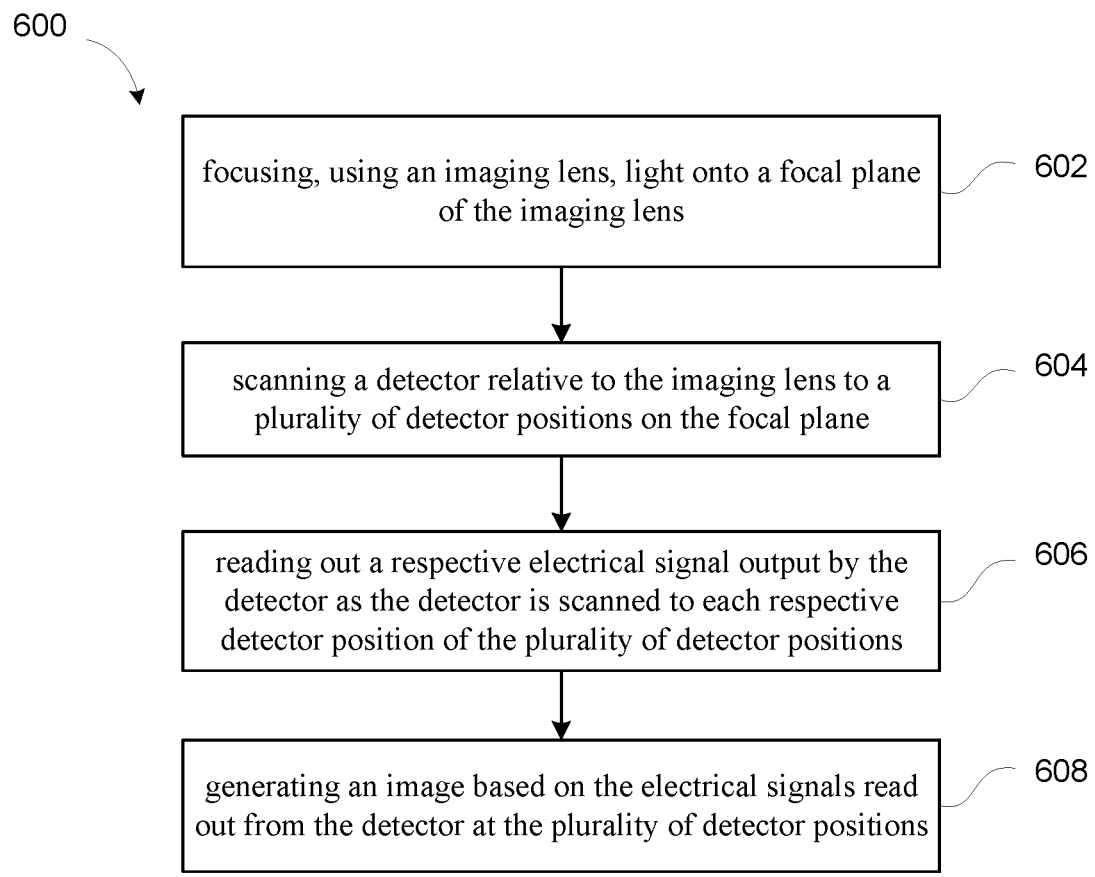
FIG. 6 shows a simplified flowchart illustrating a method of generating an image according to some embodiments.

FIG. 6 shows a simplified flowchart illustrating a method 600 of generating an image according to some embodiments. The method 600 includes, at 602, focusing, using an imaging lens, light onto a focal plane of the imaging lens; and at 604, scanning a detector relative to the imaging lens to a plurality of detector positions on the focal plane. The method 600 further includes, at 606, reading out a respective electrical signal output by the detector as the detector is scanned to each respective detector position of the plurality of detector positions; and at 608, generating an image based on the electrical signals read out from the detector at the plurality of detector positions. In some embodiments, the method 600 further includes scanning the imaging lens to a plurality of lens positions in a plane substantially perpendicular to an optical axis of the imaging lens.

It should be appreciated that the specific steps illustrated in FIG. 6 provide a particular method of generating an image according to some embodiments of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to explain the principles of the invention and its practical applications to thereby enable others skilled in the art to utilize the invention in various embodiments and with various modifications as are suited to the particular use contemplated.

A recitation of "a", "an" or "the" is intended to mean "one or more" unless specifically indicated to the contrary.

Ranges may be expressed herein as from "about" one specified value, and/or to "about" another specified value. The term "about" is used herein to mean approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. When such a range is expressed, another embodiment includes from the one specific value and/or to the other specified value. Similarly, when values are expressed as approximations, by use of the antecedent "about," it will be understood that the specified value forms another embodiment. It will be further understood that the endpoints of each of the ranges are included with the range.

What is claimed is:

1. An imaging system comprising:
a base;
an imaging lens fixedly attached to the base;
a board;
a first set of flexures flexibly attaching the board to the base;
a detector mounted on the board and positioned substantially at an image plane of the imaging lens, the detector configured to detect light focused by the imaging lens and incident thereon;
a driving mechanism configured to scan the board via the first set of flexures in a plane substantially perpendicular to an optical axis of the imaging lens, thereby scanning the detector to a plurality of image positions in the image plane; and
electronic circuitry configured to:
read out a respective electrical signal output by the detector as the detector is scanned to each respective image position of the plurality of image positions in the image plane; and
generate an image based on the electrical signals read out from the detector at the plurality of image positions.

2. The imaging system of claim 1 further comprising an encoder for determining the respective image position of the detector as the respective electrical signal is read out by the electronic circuitry.

3. The imaging system of claim 1 wherein the driving mechanism is configured to scan the board in two dimensions.

4. The imaging system of claim 3 wherein the first set of flexures comprises a plurality of bendable beams.

5. The imaging system of claim 3 wherein the board is scanned in a Lissajous pattern.

6. The imaging system of claim 1 wherein the driving mechanism comprises a voice coil, a piezoelectric transducer, or a linear motor.

7. The imaging system of claim 1 wherein the detector comprises an infrared detector.

8. The imaging system of claim 7 wherein the infrared detector comprises a narrow band-gap semiconductor infrared detector or an infrared bolometer.

9. The imaging system of claim 1 wherein the detector comprises a single-photon detector, an avalanche semiconductor detector, or a photo-multiplier tube.

10. The imaging system of claim 1 further comprising:
a counterbalance structure; and
a second set of flexures flexibly attaching the counterbalance structure to the base;
wherein the driving mechanism is further configured to scan the counterbalance structure via the second set of flexures synchronously with the scanning of the board, so that the counterbalance structure and the board move in opposite directions at any instant.

11. An imaging system comprising:
a base;
an imaging lens;
a first set of flexures flexibly attaching the imaging lens to the base;
a board;
a detector mounted on the board and positioned substantially at a focal plane of the imaging lens, the detector configured to detect light focused by the imaging lens and incident thereon;
a driving mechanism configured to scan the imaging lens via the first set of flexures to move the imaging lens to a plurality of lens positions in a first plane substantially perpendicular to an optical axis of the imaging lens, so that light from a respective field angle is focused onto the detector at each respective lens position; and
electronic circuitry configured to:
read out a respective electrical signal output by the detector as the imaging lens is scanned to each respective lens position; and
generate an image based on the electrical signals read out from the detector at the plurality of lens positions.

12. The imaging system of claim 11 further comprising an encoder for determining the respective lens position as the respective electrical signal is read out by the electronic circuitry.

13. The imaging system of claim 11 wherein the board is fixedly attached to the base.

14. The imaging system of claim 11 further comprising a second set of flexures flexibly attaching the board to the base, wherein the driving mechanism is further configured to scan the board so that the detector is scanned to a plurality of detector positions in a second plane substantially perpendicular to the optical axis of the imaging lens.

15. The imaging system of claim 14 wherein the imaging lens and the detector are scanned synchronously so that the imaging lens and the detector move in opposite directions at any instant.

16. The imaging system of claim 14 wherein the imaging lens is scanned in a first dimension, and the detector is scanned in a second dimension orthogonal to the first dimension.

17. A method of generating an image using an imaging system, the method comprising:
focusing, using an imaging lens of the imaging system, light onto a focal plane of the imaging lens, wherein the imaging lens is fixedly attached to a base;
translating, using a driving mechanism, a board relative to the imaging lens in a plane substantially perpendicular to an optical axis of the imaging lens, wherein:
the board is translated via a set of flexures flexibly coupling the board to the base;
a detector is mounted on the board and positioned substantially at the focal plane of the imaging lens, thereby translating the board results in scanning the detector relative to the imaging lens to a plurality of detector positions on the focal plane of the imaging lens;
reading out, using an electronic circuitry of the imaging system, a respective electrical signal output by the detector as the detector is scanned to each respective detector position of the plurality of detector positions; and
generating, using the electronic circuitry of the imaging system, an image based on the electrical signals read out from the detector at the plurality of detector positions.

18. The method of claim 17 wherein the detector is scanned in two dimensions.

19. The method of claim 18 wherein the detector is scanned in a Lissajous pattern.

* * * * *